(12) United States Patent
Cao (10) Patent No.: US 7,830,211 B2
(45) Date of Patent: Nov. 9, 2010

(54) INPUT INDUCTIVE NETWORK FOR SAMPLE AND HOLD AMPLIFIERS IN HIGH SPEED DATA CONVERTERS

(75) Inventor: Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/767,649

(22) Filed: Jun. 25, 2007

(65) Prior Publication Data

US 2008/0001671 A1 Jan. 3, 2008

Related U.S. Application Data

(63) Continuation-in-part of application No. 11/320,402, filed on Dec. 28, 2005, now Pat. No. 7,362,174.

(60) Provisional application No. 60/703,908, filed on Jul. 29, 2005, provisional application No. 60/876,155, filed on Dec. 21, 2006.

(51) Int. Cl.
*H03F 3/191* (2006.01)
(52) U.S. Cl. ...................................... 330/302; 330/307
(58) Field of Classification Search .................. 330/286, 330/302, 307
See application file for complete search history.

(56) References Cited

U.S. PATENT DOCUMENTS

| | | | | |
|---|---|---|---|---|
| 5,015,968 A | * | 5/1991 | Podell et al. | 330/277 |
| 5,039,880 A | * | 8/1991 | Astegher et al. | 327/96 |
| 5,281,932 A | * | 1/1994 | Even-Or | 333/32 |
| 5,305,469 A | * | 4/1994 | Camiade et al. | 330/277 |
| 5,578,860 A | * | 11/1996 | Costa et al. | 257/528 |
| 6,300,827 B1 | * | 10/2001 | King | 330/65 |
| 6,624,699 B2 | | 9/2003 | Yin et al. | |
| 6,680,659 B2 | * | 1/2004 | Miller | 333/33 |
| 6,774,718 B2 | * | 8/2004 | Ichitsubo et al. | 330/129 |
| 2006/0033561 A1 | * | 2/2006 | Perdoor et al. | 330/9 |
| 2007/0024369 A1 | | 2/2007 | Cao | |

* cited by examiner

*Primary Examiner*—Khanh V Nguyen
(74) *Attorney, Agent, or Firm*—Sterne, Kessler, Goldstein & Fox P.L.L.C.

(57) ABSTRACT

An input inductor or input inductive network is used to improve the performance of circuits working in discrete time domain, especially a sample and hold circuit. Input series inductors resonate with the capacitance at the input of the sample and hold at high frequencies to extend its bandwidth. At high frequencies, the inductors act as high impedance chokes between the termination resistor and the capacitors and thus also improve the input reflection of the chip.

11 Claims, 8 Drawing Sheets

INPUT INDUCTIVE NETWORK FOR SAMPLE AND HOLD AMPLIFIERS IN HIGH SPEED DATA CONVERTERS

CROSS REFERENCE TO RELATED APPLICATIONS

This application is a Continuation-In-Part of co-pending U.S. patent application Ser. No. 11/320,402, filed on Dec. 28, 2005 by CAO, Jun, entitled CURRENT-CONTROLLED CMOS (C3MOS) WIDEBAND INPUT DATA AMPLIFIER FOR REDUCED DIFFERENTIAL AND COMMON-MODE REFLECTION, the entire contents of which is incorporated by reference, and for which priority is claimed under 35 U.S.C. §120. As in the parent application Ser. No. 11/320, 402, priority is claimed to U.S. Provisional Application No. 60/703,908, filed on Jul. 29, 2005, the entire contents of which is also incorporated by reference, and for which priority is claimed under 35 U.S.C. §119(e). This application also claims benefit to U.S. Provisional Application No. 60/876, 155, filed on Dec. 21, 2006, by CAO, Jun, entitled INPUT INDUCTIVE NETWORK FOR SAMPLE-AND-HOLD AMPLIFIERS IN HIGH-SPEED DATA CONVERTERS, the entire contents of which is incorporated by reference, and for which priority is also claimed under 35 U.S.C. §119(e).

BACKGROUND

High speed wideband sample-and-hold amplifiers (SHA) are widely used in analog-to-digital data converters (ADC). For a number of reasons including speed limitations of process technology, power consumption and other cost related concerns, it is desirable to increase the bandwidth of a SHA to improve its performance and the performance of an ADC into which it is incorporated for use at higher data rates. This is especially true for circuitry fabricated using standard CMOS process technology, which is the preferred technology for system integration but has inferior circuit speed, compared to other more expensive technologies, such as bipolar, SiGe or III-V semiconductors.

Moreover, when implementing SHAs onto silicon substrates and into packages (e.g., within integrated circuits), there is oftentimes difficulty in interfacing between circuitry within an integrated circuit and bond wires, traces, and/or pads to which this circuitry communicatively couples. This interface is generally referred to as the interface between a silicon chip and a package and/or circuit board. It is often difficult to impedance match at these interfaces. To implement this interfacing, stripline and microstrip transmission lines may be employed.

Stripline and microstrip transmission lines are transverse electromagnetic (TEM) and quasi-TEM structures, respectively. Ideally, waves that propagate on these structures have propagation constants that are predominantly linear with frequency and hence phase velocities that are nearly constant with frequency. In isolation, these lines exhibit a single-ended characteristic impedance, phase velocity and attenuation. For instance, if a transmission line having a 50 Ω characteristic impedance is terminated with a 50 Ωload, there is no reflection at the interface between the transmission line and the load.

However, in actual applications, various non-linearities cause there to be an impedance mismatch at the interface between the silicon chip and package and/or circuit board, which may cause significant signal reflection at the interface and thus degrade signal integrity. Such non-linearities can result from various phenomena.

A first example of such a non-linearity relates to the physical placement of transmission lines. As a pair of striplines or microstrip transmission lines are moved closer to one another, for example, at a package substrate, coupling occurs between those transmission lines that significantly alters the transmission parameters of these lines.

A second example of such a non-linearity relates to the bonding wires themselves. Bonding wires connecting package to silicon die usually exhibit inductive impedance at a multi GHz. data rate. Thus, the bonding wire itself causes an impedance mis-match.

A third example relates to loading. Capacitive loading to a signal path from a bonding pad and/or an electrostatic discharge device (ESD) structure at the silicon die becomes more and more significant as the data rate increases, even if termination resistors are placed very close to the input pads. Furthermore, capacitive loading from transistors at an input of a data amplifier creates short circuits in parallel with the termination resistor and reduces the overall impedance at higher frequencies, which results in reduced bandwidth of the input data amplifier and increased signal reflection at its input.

Figure 1:
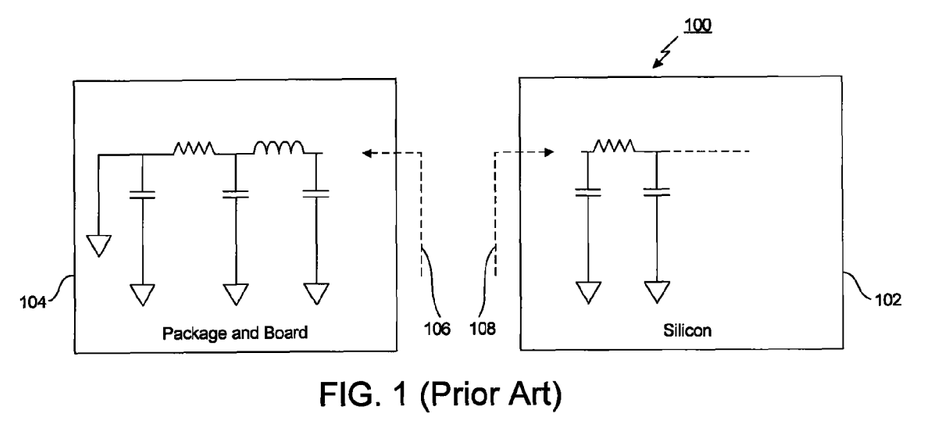
FIG. 1 (Prior Art) is a schematic diagram illustrating impedance mismatch at the interface of silicon and package/board.

FIG. 1 (Prior Art) is a schematic diagram illustrating impedance mismatch 100 at an interface of silicon 102 and package/board 104. In a single-ended configuration represented by lumped elements, the mismatch 100 at the interface of silicon and package/board can be represented as shown. At the interface, looking towards the package and/or circuit board side (represented by arrow 106), the impedance is predominantly inductive. In contrast, looking towards the silicon side (represented by arrow 108), the impedance is predominantly capacitive.

Figure 2:
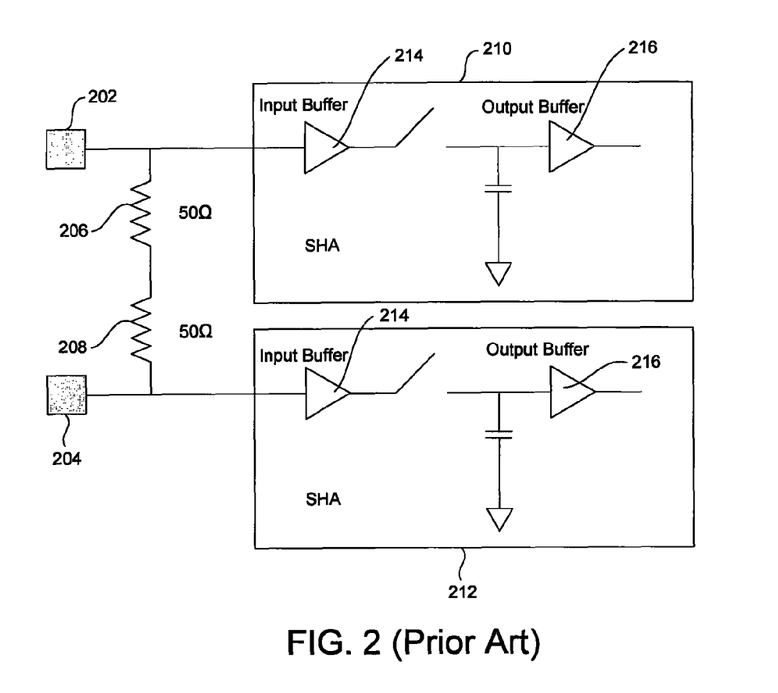
FIG. 2 (Prior Art) is a schematic diagram showing a conventional connection of input pads and termination load resistors with the sample and hold amplifier of an ADC.

FIG. 2 (Prior Art) is a schematic diagram showing a conventional connection of input pads 202, 204 and termination load resistors 206, 208 with a sample and hold amplifier 210, 212 of an ADC (not shown). Each SHA includes an input buffer 214 and an output buffer 216. Particular to SHA in ADC, it is crucial for the circuit to preserve the integrity of data input at pads 202, 204. Distortion of a signal due to bandwidth limitation and reflection caused by input impedance mismatch will degrade data converter performance no matter how accurate are stages following the SHA. A conventional connection of input pads 202, 204 and termination load resistors 206, 208 with the input sample-and-hold amplifier of an ADC may cause such problems.

Bandwidth and impedance mismatch can be reduced by limiting the impact of load capacitance. In commonly-assigned U.S. patent application Ser. No. 10/028,806, now U.S. Pat. No. 6,624,699 B2, entitled "Current-controlled CMOS wideband data amplifier circuits," by Guangming Yin and Jun Cao, a pair of series inductors is connected to gates of an input differential pair to form a current-controlled CMOS wideband data amplifier circuit having expanded bandwidth. In commonly-assigned U.S. patent application Ser. No. 11/320, 402 (US Patent Publication 2007/0024369), entitled "Current-controlled CMOS (C3MOS) wideband input data amplifier for reduced differential and common-mode reflection," by Jun Cao, an inductive network is connected to the wideband data amplifier to improve performance of a conventional differential pair. These solutions represent efforts to improve performance of circuits working in the continuous time domain.

SUMMARY

This section is for the purpose of summarizing some aspects of the inventions described more fully in other sections of this patent document. It briefly introduces some preferred embodiments. Simplifications or omissions may be made to avoid obscuring the purpose of the section. Such simplifications or omissions are not intended to limit the scope of the claimed inventions.

The inventions can be implemented in numerous ways, including methods, systems, devices, and computer readable medium. Several embodiments of the inventions are discussed below, but they are not the only ways to practice the inventions described herein.

The inventions described in this patent document relate in general to utilizing an input inductor or input inductive network to improve the performance of circuits working in discrete time domain. The inventions are particularly useful in their application to sample-and-hold circuits which, at their inputs, require a high degree of input signal integrity. Input series inductors resonate with the capacitance at the input of the SHA at high frequencies and thus extend the bandwidth of the amplifier. In addition, at high frequencies, the inductors act as high impedance chokes between the termination resistor and the capacitors and thus also limit input reflection of the chip.

Input inductive networks disclosed include a single input inductor and various numbers of inductive circuit stages each including an input capacitor to ground, series inductor and output capacitor to ground.

BRIEF DESCRIPTION OF THE DRAWINGS/FIGURES

Various features, aspects, and advantages of the inventions will become better understood with regard to the following description, appended claims, and accompanying drawings where:

DETAILED DESCRIPTION

The inventions described in this patent document relate in general to utilizing an input inductor or input inductive network to improve the performance of circuits working in discrete time domain. The inventions are particularly useful in sample-and-hold circuits which, at the inputs, require a high degree of input signal integrity. Input series inductors resonate with the capacitance at the input of the SHA at high frequencies and thus extend the bandwidth of the amplifier. In addition, at high frequencies, the inductors act as high impedance chokes between the termination resistor and the capacitors and thus also improve the input reflection of the chip.

In the following description, numerous specific details are set forth in order to provide a thorough understanding of the present invention. However, it will be apparent to those skilled in the art that the inventions described herein may be practiced without these specific details. The description and representation herein are common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the inventions are discussed herein with reference to FIGS. 3-9. However, those skilled in the art will readily appreciate that the detailed description given herein with respect to these figures is for explanatory purposes as the inventions extend beyond these limited embodiments.

Figure 3:
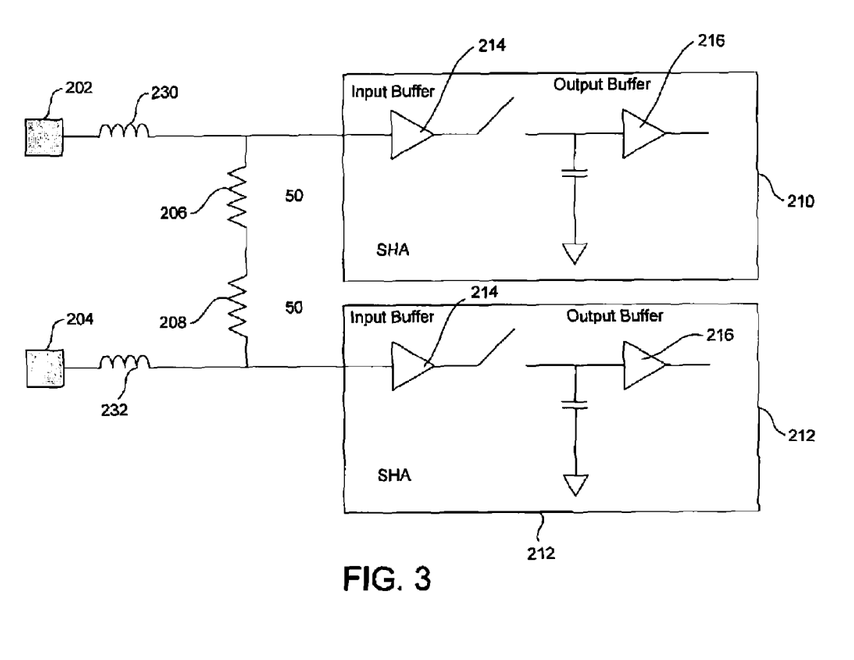
FIG. 3 is a schematic diagram showing sample-and-hold amplifiers with series inductor connected to the input pads to have expanded bandwidth and reduced reflection at the input.

FIG. 3 is a schematic diagram showing sample-and-hold amplifiers with series inductors 330, 332 connected to input pads 202, 204. Inductors 330, 332 effectively expand bandwidth and reduce reflection at the inputs of the SHA. Referring again to FIG. 1 (Prior Art), to match impedance looking towards the package/board side and looking towards the silicon, it is advantageous to make the input more inductive. On the other hand, one would still like to utilize the bandwidth expansion created by gate-connected inductors. A SHA at the input of the chip can be arranged as shown in FIG. 3, together with the input pads 202, 204 and 50 Ω termination resistors 206, 208. In the FIG. 3 embodiment input inductors 330, 332 resonate with capacitance (not shown in FIG. 3) associated with the inputs and create peaking at high frequency in the frequency response. This helps to extend the bandwidth of the data amplifier. Input inductors 330, 332 also make the input impedance more inductive and thus match better with the board/package. This reduces reflection at the interface between the silicon and package/board.

Figure 4A:
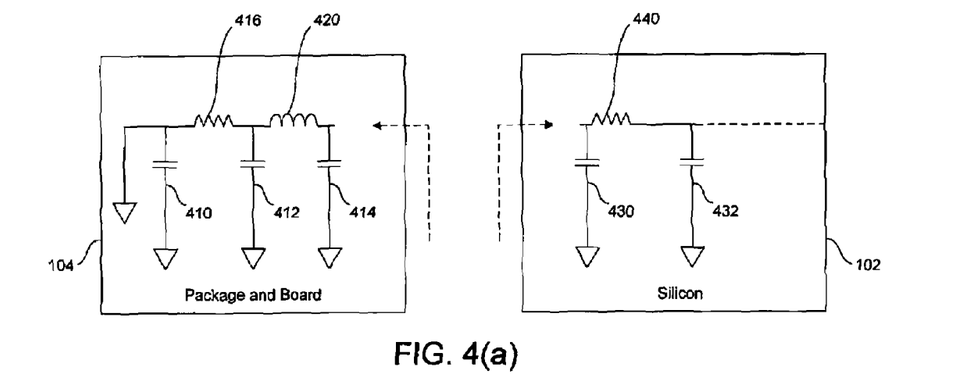
FIG. 4(a) is a schematic diagram showing matching at the interface of silicon and package/board in a single-ended configuration represented by lumped elements for the circuits in FIG. 2.
Figure 4B:
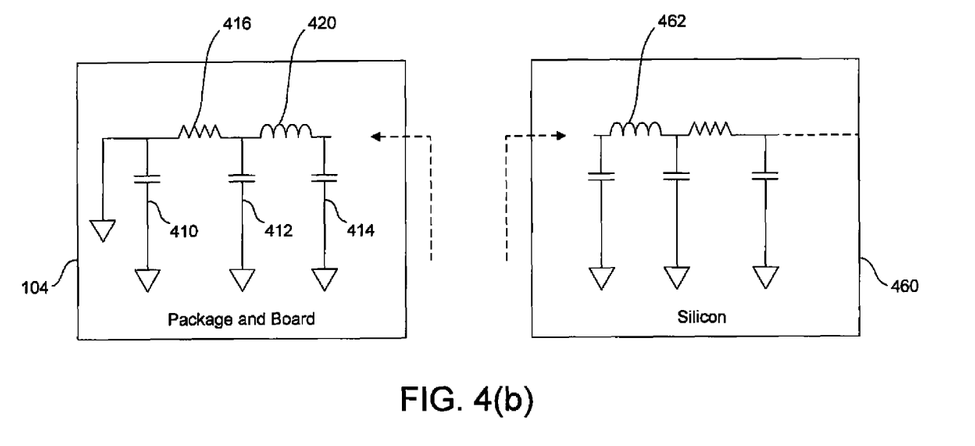
FIG. 4(b) is a schematic diagram showing matching at the interface of silicon and package/board in a single-ended configuration represented by lumped elements for the circuits in FIG. 3.

Some advantages of the circuit arrangement shown in FIG. 3 are explained with reference to FIGS. 4(a) and 4(b). FIG. 4(a) is a schematic diagram showing matching at the interface of silicon and package/board in a single-ended configuration represented by lumped elements for the circuits in FIG. 2. FIG. 4(b) is a schematic diagram showing matching at the interface of silicon and package/board in a single-ended configuration represented by lumped elements for the circuits in FIG. 3. In FIGS. 4(a) and 4(b), a package and board are represented by lumped capacitors 410, 412 and 414, resistor 416 and inductor 420. In FIG. 4(a), the silicon circuit 102 is represented by lumped elements including capacitors 430 and 432 and resistor 440. FIG. 4(b) shows a silicon circuit 460 that differs from silicon circuit 102 in that it further includes an inductor 462.

The addition of inductor 462 in silicon circuit 460 allows the circuit arrangement of FIG. 3 to provide better matching in the single-ended configuration, which is applicable to common-mode reflections. For the differential mode, the circuit arrangement shown in FIG. 3 also reduces the input reflection by matching the impedance looking towards the silicon to the impedance looking toward the board/package, as shown in FIG. 5, discussed below.

Figure 5:
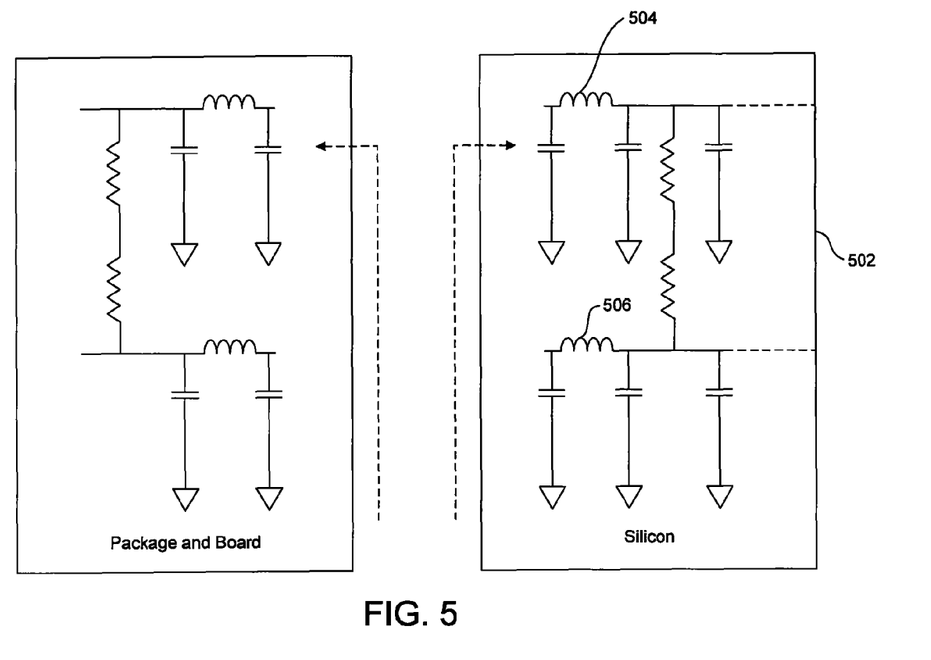
FIG. 5 is a schematic diagram showing matching at the interface of silicon and package/board in a differential mode configuration represented by lumped elements for the circuits in FIG. 3.

FIG. 5 is a schematic diagram showing matching at the interface of silicon and package/board in a differential mode configuration represented by lumped elements for the circuits in FIG. 3. Silicon circuit 502 includes input inductors 504 and 506. It is helpful if input inductors 504 and 506 are well chosen to have a low series parasitic resistance so that they do not to degrade reflection at very low frequencies. Stated in another way, the inductors' quality factor should advantageously be reasonably high. This is also helps to extend the bandwidth more effectively because if the quality factor is too low the resonant peak in the frequency response of the input data amplifier will be too small to impact on the overall bandwidth. For ease of explanation, the silicon circuits shown in FIG. 5 include only a single inductor. The inventions contemplate alternative embodiments in which the input circuit can be any of various inductive networks, such as, for example, shown in FIG. 6.

Figure 6A:
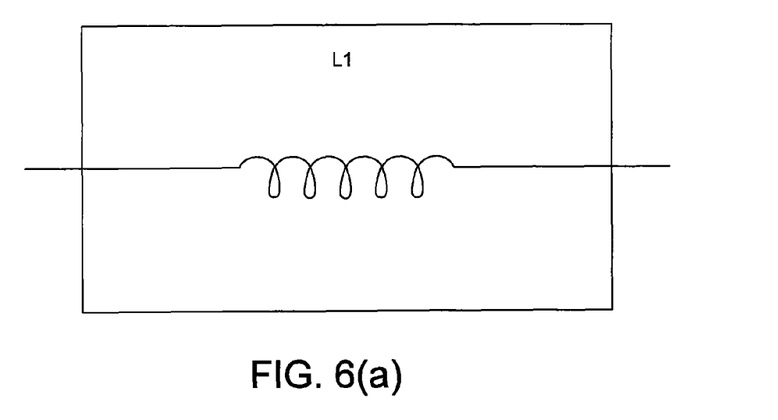
FIGS. 6(a)-6(d) are schematic diagrams showing examples of input inductive network which can be connected to the SHA to increase bandwidth and improve impedance matching.
Figure 6B:
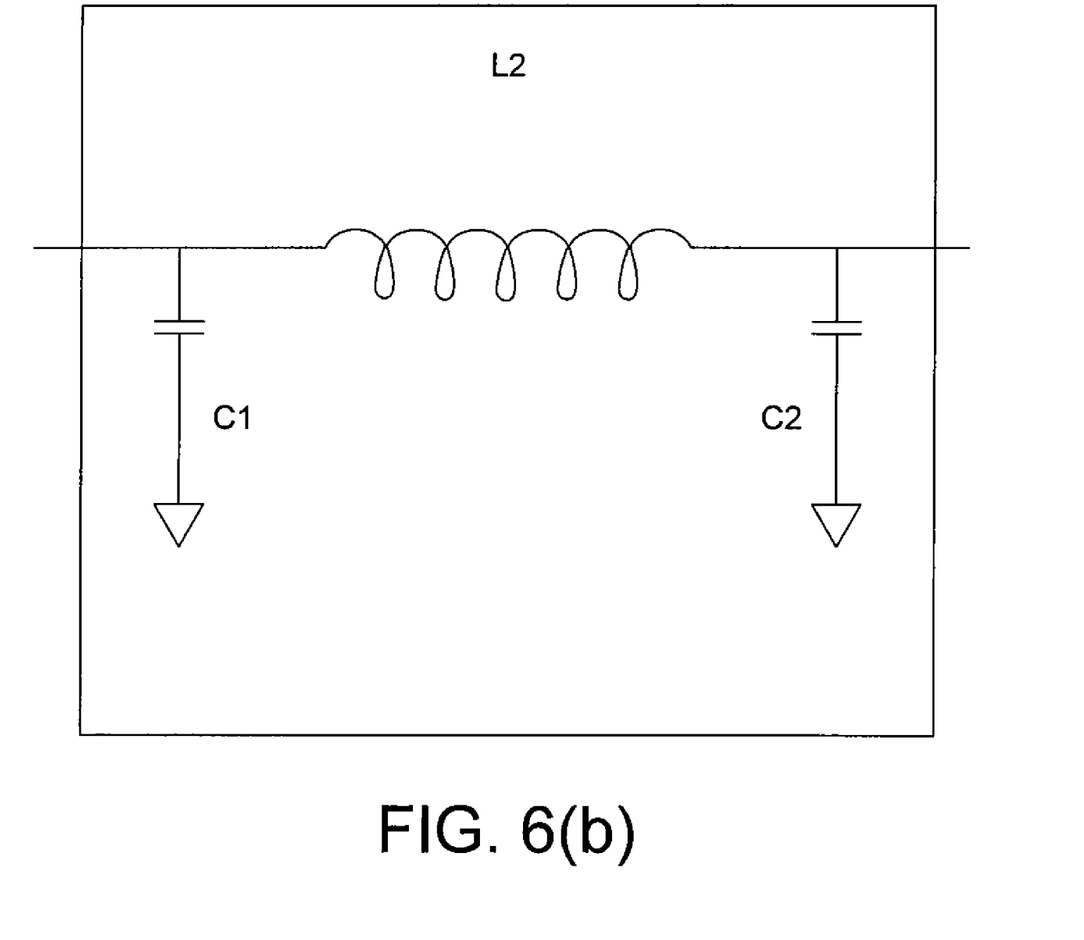
Figure 6C:
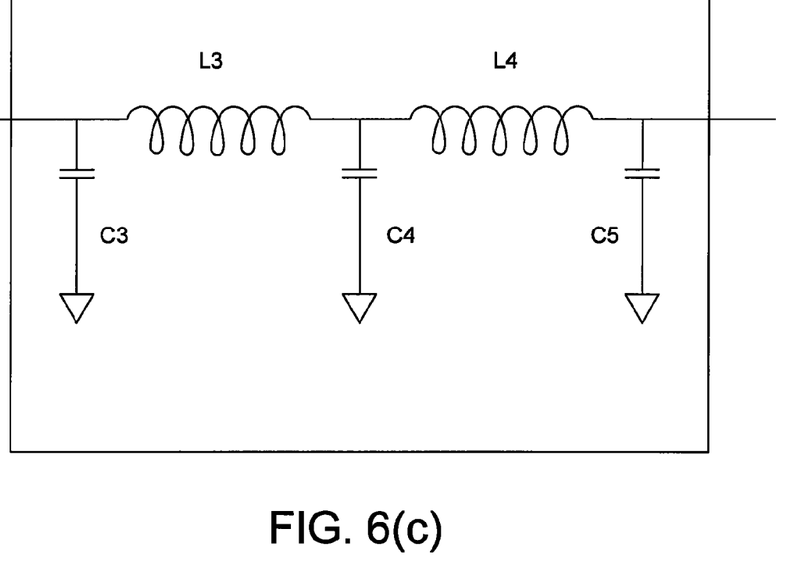
Figure 6D:
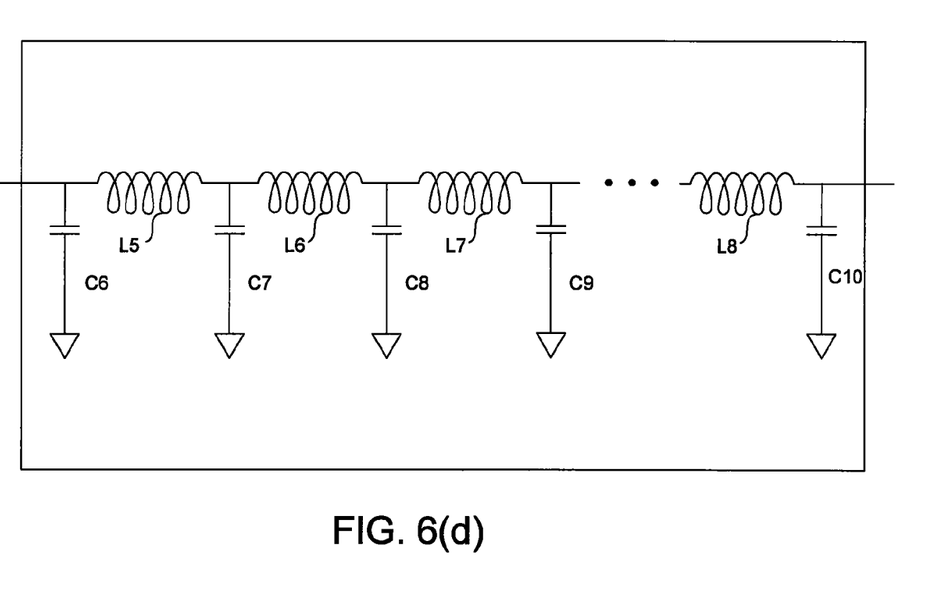

FIGS. 6(a)-6(d) are schematic diagrams showing examples of input inductive network which can be connected to the SHA to increase bandwidth and improve impedance matching. FIG. 6(a) illustrates the simple case of a single inductor. FIG. 6(b) illustrates a one stage inductive network including a series inductor with input and output capacitors shunted to ground. FIG. 6(c) illustrates a two stage inductive network including two series inductors with input, middle stage and output capacitors shunted to ground. FIG. 6(d) illustrates an N-stage inductive network repeating the pattern shown in FIG. 6(c).

Under various circumstances, the circuit arrangement shown in the FIG. 3 embodiment can be further improved by replacing the inductor with an inductive network having multiple inductors, resistors and capacitors. These additional elements can be used to match impedance looking toward the board/package more precisely within a broader frequency range and at the same time to create a resonant circuit to generate peaking at high frequency so that the bandwidth of the circuit can be extended. In this case, the overall series resistance in the matching inductive network should be made small in order to still have a good impedance matching at the low frequencies and to be able to create effective peaking to extend the bandwidth.

Using the principles set forth herein, a circuit designer has a great deal of latitude in selecting values of individual components of the input matching impedance network in an effort to match the impedance of the package and/or circuit board. This is also true with respect to the individual sub-components of the input matching impedance network. Some additional alternative embodiments (but not all possible embodiments) by which these various blocks may be implemented are shown in FIG. 6.

Figure 7:
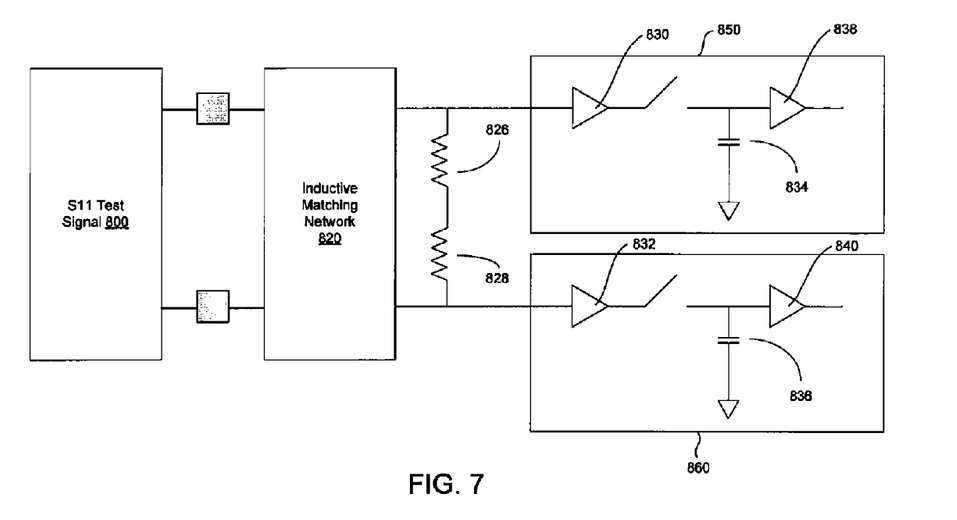
FIG. 7 is a schematic diagram of simulating circuit for an input S11 of a receiver with an inductive network per the present inventions at the input.
Figure 8:
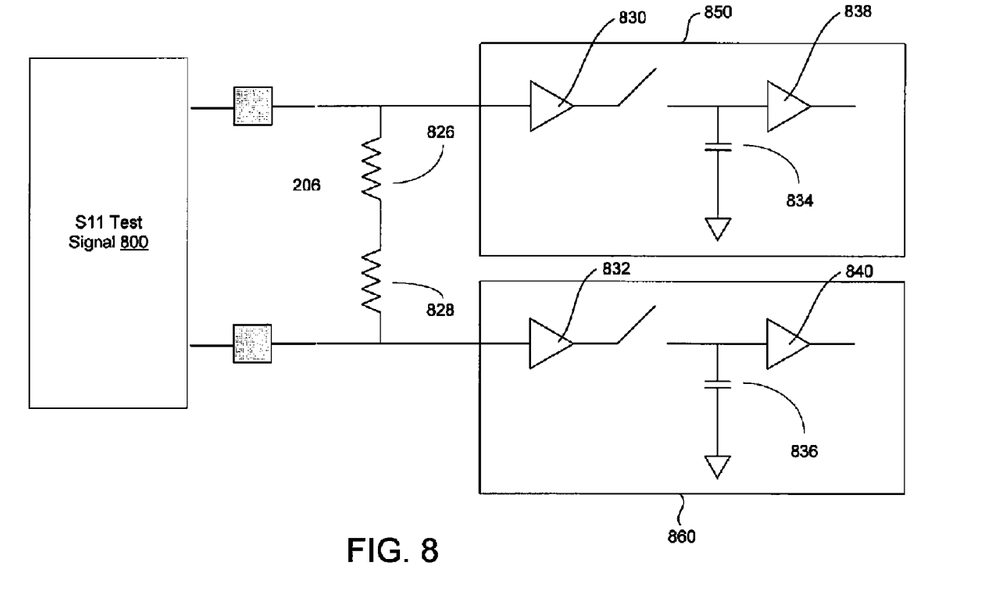
FIG. 8 is a schematic diagram of simulating circuit for an input S11 of a receiver without an inductive network (only using 50 Ω resistors) per the present inventions at the input.

Performance of circuit designs based on the principles described above can be simulated using arrangements set forth in FIGS. 7 and 8. FIG. 7 is a schematic diagram of simulating circuit for an input S11 of a receiver with an inductive network per the present inventions at the input. A S11 test signal is coupled through connection pads to an inductive matching network 820 according to the inventions. At the output of inductive matching network 820 there are coupled a series pair of Ω resistors 826, 828. A first sample and hold amplifier circuit 850 is coupled to an upper output terminal of inductive matching network 820 and a second sample and hold amplifier circuit 860 is coupled to an lower output terminal of inductive matching network 820. Sample and hold amplifier circuit 850 includes an input buffer 830 that is switch coupled to an input of an output buffer 838. The input of output buffer 838 is grounded through a capacitor 834. Sample and hold amplifier circuit 860 is identical to sample and hold amplifier circuit 850 and includes an input buffer 832 that is switch coupled to an input of an output buffer 840. The input of output buffer 840 is grounded through a capacitor 836. Circuit values are selected based on particular circuits under test. For example, circuit values may be selected for inputs for a 10 Gbps receiver. To simulate reality as close as possible, included in the simulation are the measured S11 model for the package, the extracted parasitics for pads and interconnects and the actual S/H circuits employed by the test chip.

FIG. 8 is a schematic diagram of simulating circuit for an input S11 of a receiver without an inductive network. FIG. 8 is identical to FIG. 7 except for the absence of inductive matching network 820 per the present inventions. The only matching provided is the presence of the pair of 50 Ω resistors 826, 828.

Figure 9:
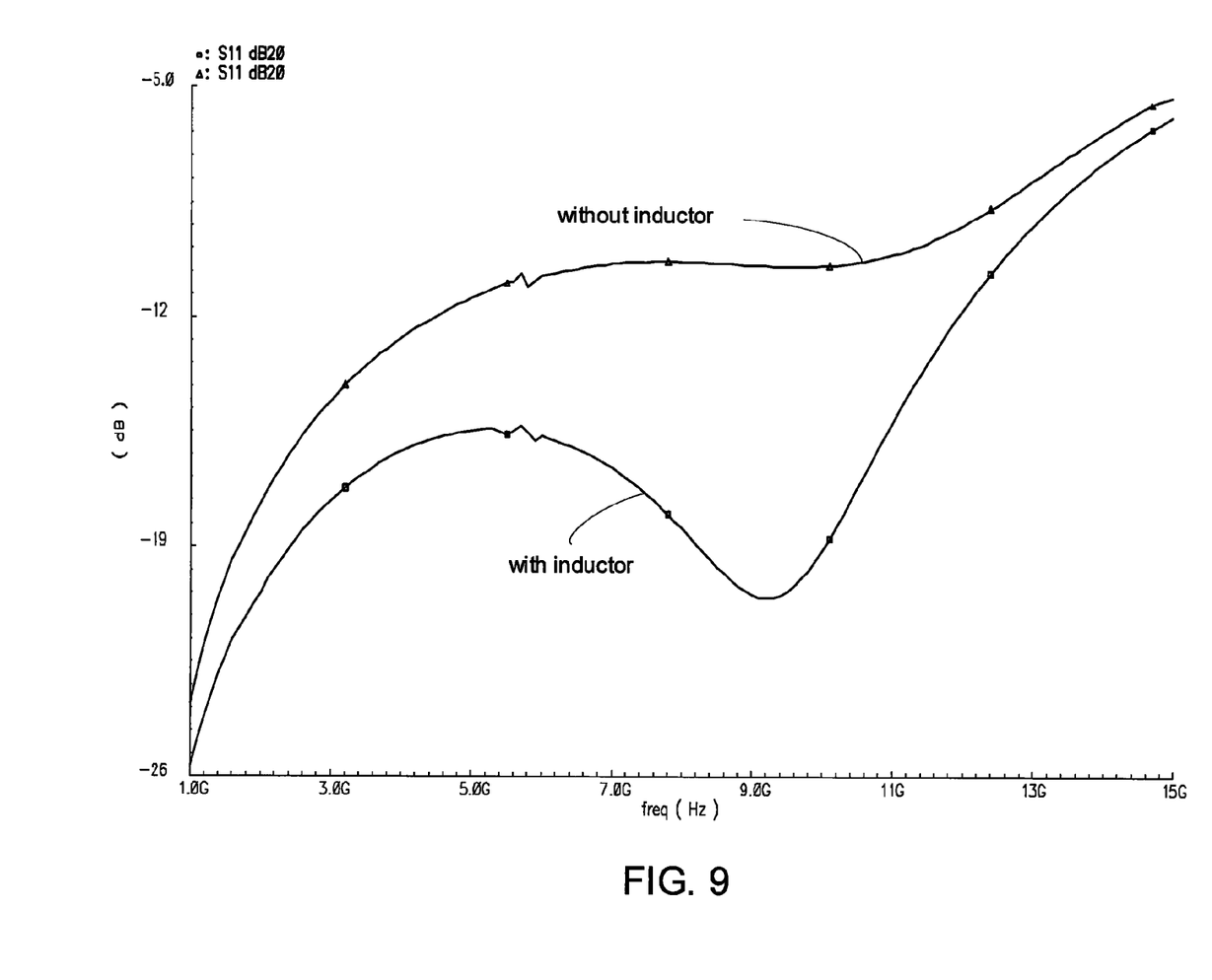
FIG. 9 is a graphical representation of a comparison of input S11 of a receiver with and without inductors at the input.

FIG. 9 is a graphical representation of results achieved using the simulator circuits shown in FIGS. 7 and 8. The two lines of the graph allow for comparison of inputs S11 of a receiver with and without an inductive matching network at the input. The inclusion of inductors as described in this patent document improve S11 and extend the bandwidth of a S/H circuit. This result is important for multi-gigabit data converters. Using a standard network analyzer, one can measure the S11 of the high speed data input port. One application of the principles of the inventions described herein is for transmission channels including multi-mode fiber.

The results graphically set forth in FIG. 9 demonstrate that the use of an input inductor (or inductive network) improves S11 significantly for a very wide range of input frequencies (at least from 1 GHz to 15 GHz in the above case). If no matching inductor is employed, the capacitance from the package, pad and internal circuit together with the inductance and resistance along the data path with put a fundamental limitation for S11, which can only be solved by adding an inductive network at the input. An input inductive matching network usually resonates with the input capacitors at a certain frequency and thus creates a 'null' in the S11 spectrum. Since the on-chip inductors are usually of small value and Q, this 'null' usually is at the higher end of the spectrum and should be quite wide (in the above case, the null is at approximately $0.9 f_0$ and has a '3 dB width' of approximately $0.3 f_0$).

The inventions have been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. An integrated circuit arrangement, comprising:
   a discrete time domain circuit having an input which has an input impedance that is capacitive in a desired operating frequency range; and
   a matching network, coupled to the input of the discrete time domain circuit, the matching network including at least one resistive element and an inductive circuit coupled between an input of the matching network and the input of the discrete time domain circuit and being configured to resonate with the capacitive input impedance of the discrete time domain circuit in the desired operating frequency range so as to extend a bandwidth of the discrete time domain circuit.

2. A circuit arrangement according to claim 1 wherein the inductive circuit is a single inductor.

3. A circuit arrangement according to claim 1 wherein the inductive circuit comprises a single stage circuit including a first parallel capacitor, a first series inductor and a second parallel capacitor.

4. A circuit arrangement according to claim 1 wherein the inductive circuit comprises a two stage circuit including a first parallel capacitor, a first series inductor, a second parallel capacitor, a second series inductor, and a third parallel capacitor.

5. A circuit arrangement according to claim 1 wherein the inductive circuit is a multi-stage inductive circuit.

6. An integrated circuit arrangement, comprising:
   a sample and hold amplifier (SHA) circuit having an input that has a capacitive impedance in a desired operating frequency range; and
   a matching network, coupled to the input of the SHA, the matching network including at least one resistive element and an inductive circuit coupled between an input of the matching network and the input of the SHA circuit and being configured to resonate with the capacitive input impedance of the SHA circuit in the desired operating frequency range so as to extend a bandwidth of the SHA circuit.

7. A circuit arrangement according to claim 6 wherein the SHA circuit is part of an analog to digital converter (ADC).

8. A circuit arrangement according to claim 6 wherein the inductive circuit is a single inductor.

9. A circuit arrangement according to claim 6 wherein the inductive circuit comprises a single stage circuit including a first parallel capacitor, a first series inductor and a second parallel capacitor.

10. A circuit arrangement according to claim 6 wherein the inductive circuit comprises a two stage circuit including a first parallel capacitor, a first series inductor, a second parallel capacitor, a second series inductor, and a third parallel capacitor.

11. A circuit arrangement according to claim 6 wherein the inductive circuit is a multi-stage inductive circuit.

* * * * *